(12) United States Patent
Kuan et al.

(10) Patent No.: US 10,861,800 B2
(45) Date of Patent: Dec. 8, 2020

(54) INTEGRATED CIRCUIT STRUCTURE HAVING A CROWN-SHAPED SEMICONDUCTOR STRIP AND AN ISOLATION REGION RECESSED IN THE SUBSTRATE

(71) Applicant: Taiwan Semiconductor Manufacturing Company, Ltd., Hsinchu (TW)

(72) Inventors: Wan-Chun Kuan, Chiayi (TW); Chih-Teng Liao, Hsinchu (TW); Yi-Wei Chiu, Kaohsiung (TW); Tzu-Chan Weng, Kaohsiung (TW)

(73) Assignee: Taiwan Semiconductor Manufacturing Company, Ltd., Hsin-Chu (KR)

( * ) Notice: Subject to any disclaimer, the term of this patent is extended or adjusted under 35 U.S.C. 154(b) by 0 days.

(21) Appl. No.: 16/426,195

(22) Filed: May 30, 2019

(65) Prior Publication Data
US 2019/0295960 A1 Sep. 26, 2019

Related U.S. Application Data

(60) Continuation of application No. 16/045,298, filed on Jul. 25, 2018, now Pat. No. 10,679,950, which is a
(Continued)

(51) Int. Cl.
*H01L 29/06* (2006.01)
*H01L 29/66* (2006.01)
(Continued)

(52) U.S. Cl.
CPC ...... *H01L 23/562* (2013.01); *H01L 21/30604* (2013.01); *H01L 21/76224* (2013.01);
(Continued)

(58) Field of Classification Search
CPC ..... H01L 21/823431; H01L 21/823821; H01L 21/845; H01L 27/0886; H01L 27/0924; H01L 27/10826; H01L 27/10879; H01L 27/1211; H01L 29/41791; H01L 29/66795–66818; H01L 29/785–7856; H01L 2029/7857–7858; H01L 2924/13067; H01L 21/30604–30621;
(Continued)

(56) References Cited

U.S. PATENT DOCUMENTS 7,719,043 B2   5/2010  Yamagami et al.
8,501,607 B1 *  8/2013  Juengling ......... H01L 29/66795
                                                  438/587
(Continued)

FOREIGN PATENT DOCUMENTS

CN         105826193 A       8/2016

*Primary Examiner* — Younes Boulghassoul
(74) *Attorney, Agent, or Firm* — Slater Matsil, LLP

(57) ABSTRACT

An integrated circuit structure includes a semiconductor substrate having a plurality of semiconductor strips, a first recess being formed by two adjacent semiconductor strips among the plurality of semiconductor strips, a second recess being formed within the first recess, and an isolation region being provided in the first recess and the second recess. The second recess has a lower depth than the first recess.

20 Claims, 15 Drawing Sheets

Related U.S. Application Data division of application No. 15/399,237, filed on Jan. 5, 2017, now Pat. No. 10,297,555.

(60) Provisional application No. 62/368,583, filed on Jul. 29, 2016.

(51) Int. Cl.
| | | |
|---|---|---|
| *H01L 29/78* | (2006.01) | |
| *H01L 21/8234* | (2006.01) | |
| *H01L 21/84* | (2006.01) | |
| *H01L 21/762* | (2006.01) | |
| *H01L 21/306* | (2006.01) | |
| *H01L 23/00* | (2006.01) | |
| *H01L 29/08* | (2006.01) | |
| *H01L 29/10* | (2006.01) | |
| *H01L 29/161* | (2006.01) | |
| *H01L 29/24* | (2006.01) | |

(52) U.S. Cl.
CPC .. *H01L 21/76229* (2013.01); *H01L 21/76232* (2013.01); *H01L 21/823431* (2013.01); *H01L 21/845* (2013.01); *H01L 29/0649* (2013.01); *H01L 29/0847* (2013.01); *H01L 29/1083* (2013.01); *H01L 29/161* (2013.01); *H01L 29/24* (2013.01); *H01L 29/6681* (2013.01); *H01L 29/785* (2013.01); *H01L 29/7851* (2013.01); *H01L 29/0657* (2013.01); *H01L 29/66545* (2013.01); *H01L 29/7848* (2013.01)

(58) Field of Classification Search
CPC ... H01L 21/3065–30655; H01L 21/308–3088; H01L 29/0649–0653; H01L 29/0657; H01L 21/823481; H01L 21/823878; H01L 21/76232; H01L 21/76229; H01L 21/76224

See application file for complete search history.

(56) References Cited

U.S. PATENT DOCUMENTS

| | | | |
|---|---|---|---|
| 8,617,996 B1 | 12/2013 | Chi et al. | |
| 8,753,940 B1 | 6/2014 | Wei et al. | |
| 8,932,936 B2 | 1/2015 | Liu et al. | |
| 8,975,129 B1 | 3/2015 | Shieh et al. | |
| 8,987,836 B2 | 3/2015 | Kim et al. | |
| 9,406,521 B1* | 8/2016 | Liou | H01L 21/3085 |
| 9,455,198 B1 | 9/2016 | Yu et al. | |
| 9,520,392 B1 | 12/2016 | Cheng et al. | |
| 9,595,475 B2 | 3/2017 | Liaw | |
| 9,607,985 B1 | 3/2017 | Tseng et al. | |
| 9,633,905 B2 | 4/2017 | Chen et al. | |
| 9,704,973 B2 | 7/2017 | Xie et al. | |
| 9,728,535 B2 | 8/2017 | Youn et al. | |
| 9,842,931 B1 | 12/2017 | Anderson et al. | |
| 2007/0114612 A1* | 5/2007 | Ahn | H01L 27/11 257/364 |
| 2008/0029821 A1* | 2/2008 | Yamagami | H01L 21/823807 257/365 |
| 2011/0127610 A1* | 6/2011 | Lee | H01L 21/823431 257/365 |
| 2013/0277759 A1* | 10/2013 | Chen | H01L 21/823431 257/397 |
| 2014/0001562 A1 | 1/2014 | Liaw | |
| 2014/0315371 A1 | 10/2014 | Cai et al. | |
| 2014/0327074 A1 | 11/2014 | Tsao | |
| 2014/0357034 A1 | 12/2014 | Cheng et al. | |
| 2015/0069528 A1 | 3/2015 | Chiang et al. | |
| 2015/0091127 A1* | 4/2015 | Lee | H01L 29/0649 257/506 |
| 2015/0108551 A1* | 4/2015 | Shieh | H01L 27/0886 257/288 |
| 2015/0194425 A1 | 7/2015 | Wu et al. | |
| 2015/0255457 A1* | 9/2015 | Loubet | H01L 27/0886 257/77 |
| 2015/0279959 A1 | 10/2015 | Qi et al. | |
| 2015/0380438 A1 | 12/2015 | Chudzik et al. | |
| 2016/0071932 A1 | 3/2016 | Sung et al. | |
| 2016/0155670 A1 | 6/2016 | Liaw | |
| 2016/0322259 A1* | 11/2016 | Cheng | G03F 7/094 |
| 2017/0005102 A1 | 1/2017 | Feng et al. | |
| 2017/0053917 A1 | 2/2017 | Azmat et al. | |
| 2017/0103985 A1* | 4/2017 | Kim | H01L 21/823821 |
| 2017/0207096 A1 | 7/2017 | Wei et al. | |
| 2017/0352727 A1* | 12/2017 | Cheng | H01L 21/823468 |
| 2018/0040614 A1 | 2/2018 | Chang et al. | |
| 2018/0040713 A1 | 2/2018 | Chang et al. | |
| 2018/0145072 A1 | 5/2018 | Kim et al. | |
| 2018/0226403 A1 | 8/2018 | Chen et al. | |
| 2019/0148520 A1 | 5/2019 | Chang et al. | |

\* cited by examiner

United States Patent US 10,861,800 B2

INTEGRATED CIRCUIT STRUCTURE HAVING A CROWN-SHAPED SEMICONDUCTOR STRIP AND AN ISOLATION REGION RECESSED IN THE SUBSTRATE

PRIORITY CLAIM AND CROSS-REFERENCE

This application is a continuation of U.S. patent application Ser. No. 16/045,298, filed Jul. 25, 2018, and entitled "Dummy Fin Etch to Form Recesses in Substrate," which is a divisional of U.S. patent application Ser. No. 15/399,237, filed Jan. 5, 2017, and entitled "Dummy Fin Etch to Form Recesses in Substrate," now U.S. Pat. No. 10,297,555 issued May 21, 2019, which claims the benefit of the following provisionally filed U.S. patent application: Application Ser. No. 62/368,583, filed Jul. 29, 2016, and entitled "Dummy Fin Etching with Recesses," which applications are hereby incorporated herein by reference.

BACKGROUND

In the formation of FinFETs, a semiconductor substrate is typically etched first, resulting in recesses to be in the semiconductor substrate. The portions of the semiconductor substrate between the recesses are semiconductor strips. In order to reduce the pattern-loading effect, a plurality of dummy semiconductor strips is formed simultaneously as the formation of the semiconductor strips, on which FinFETs are to be formed. Residues of the dummy semiconductor strips are often left after the removal of the dummy semiconductor fins.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
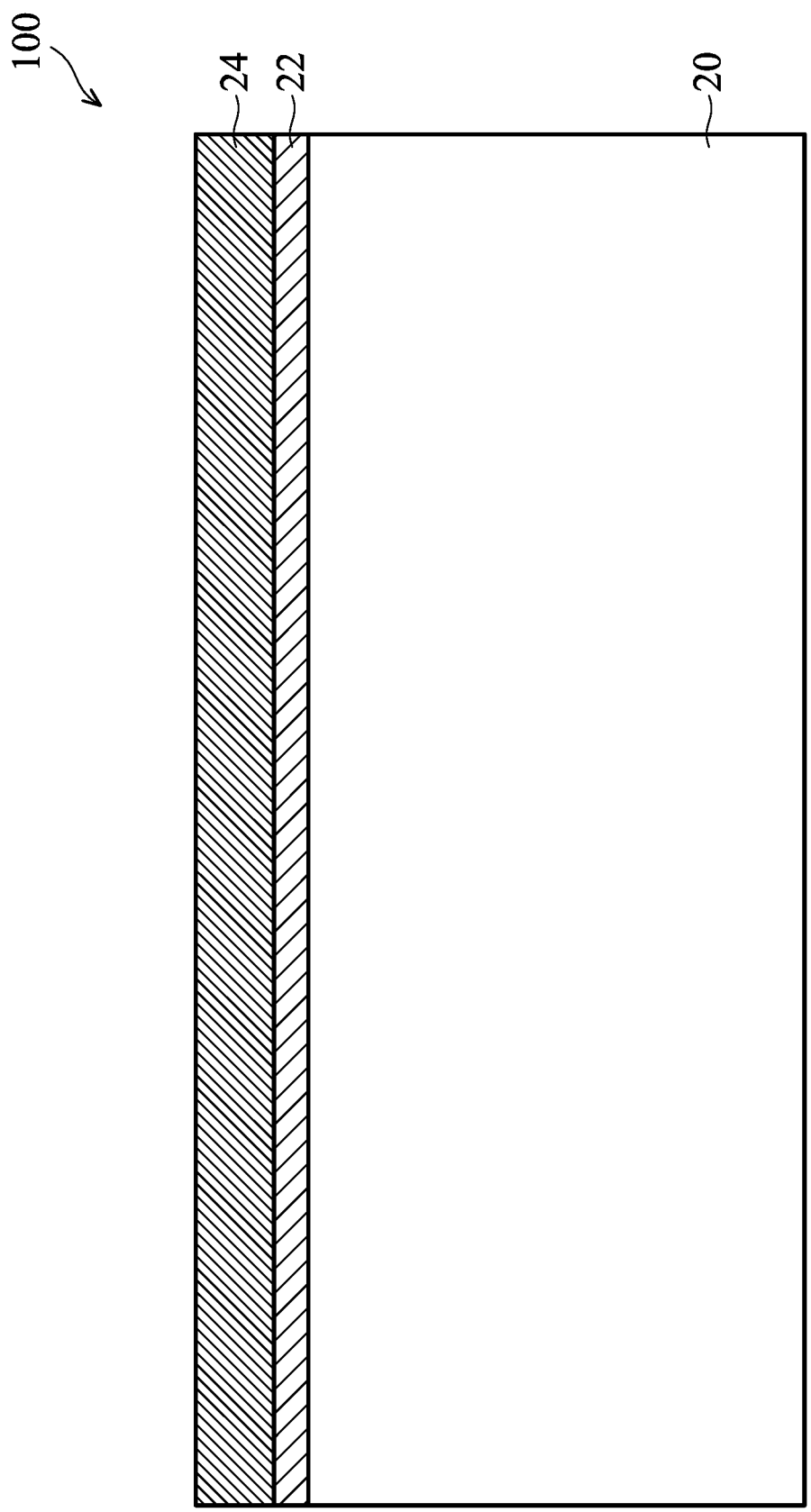
FIGS. 1 through 13 are cross-sectional views of intermediate stages in the formation of isolation regions and Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Isolation regions, Fin Field-Effect Transistors (FinFETs), and the methods of forming the same are provided in accordance with various exemplary embodiments. The intermediate stages of forming the isolation regions and the FinFETs are illustrated. The variations of some embodiments are discussed. Throughout various views and illustrative embodiments, like reference numbers are used to designate like elements.

FIGS. 1 through 13 illustrate the cross-sectional views of intermediate stages in the formation of a FinFET in accordance with some embodiments. The steps shown in FIG. 1 through 13 are also illustrated schematically in the process flow 200 shown in FIG. 14.

FIG. 1 illustrates a cross-sectional view of substrate 20, which is a part of wafer 100. Substrate 20 may be a bulk substrate or a semiconductor-on-insulator substrate. In accordance with some embodiments of the present disclosure, substrate 20 is formed of a semiconductor material selected from, and not limited to, silicon germanium, silicon carbon, germanium, and III-V compound semiconductor materials such as GaAsP, AlInAs, AlGaAs, GaInAs, GaInP, GaInAsP, and the like. Substrate 20 may be lightly doped with a p-type or an n-type impurity.

Pad oxide 22 and hard mask 24 are formed over semiconductor substrate 20. The respective step is illustrated as step 202 in the process flow shown in FIG. 14. In accordance with some embodiments of the present disclosure, pad oxide 22 is formed of silicon oxide, which may be formed by oxidizing a surface layer of semiconductor substrate 20. Hard mask 24 may be formed of silicon nitride, silicon oxynitride, silicon carbide, silicon carbo-nitride, or the like. In accordance with some embodiments of the present disclosure, mask layer 24 is formed of silicon nitride, for example, using Low-Pressure Chemical Vapor Deposition (LPCVD). In accordance with other embodiments of the present disclosure, mask layer 24 is formed by thermal nitridation of silicon, Plasma Enhanced Chemical Vapor Deposition (PECVD), or plasma anodic nitridation.

Figure 2:
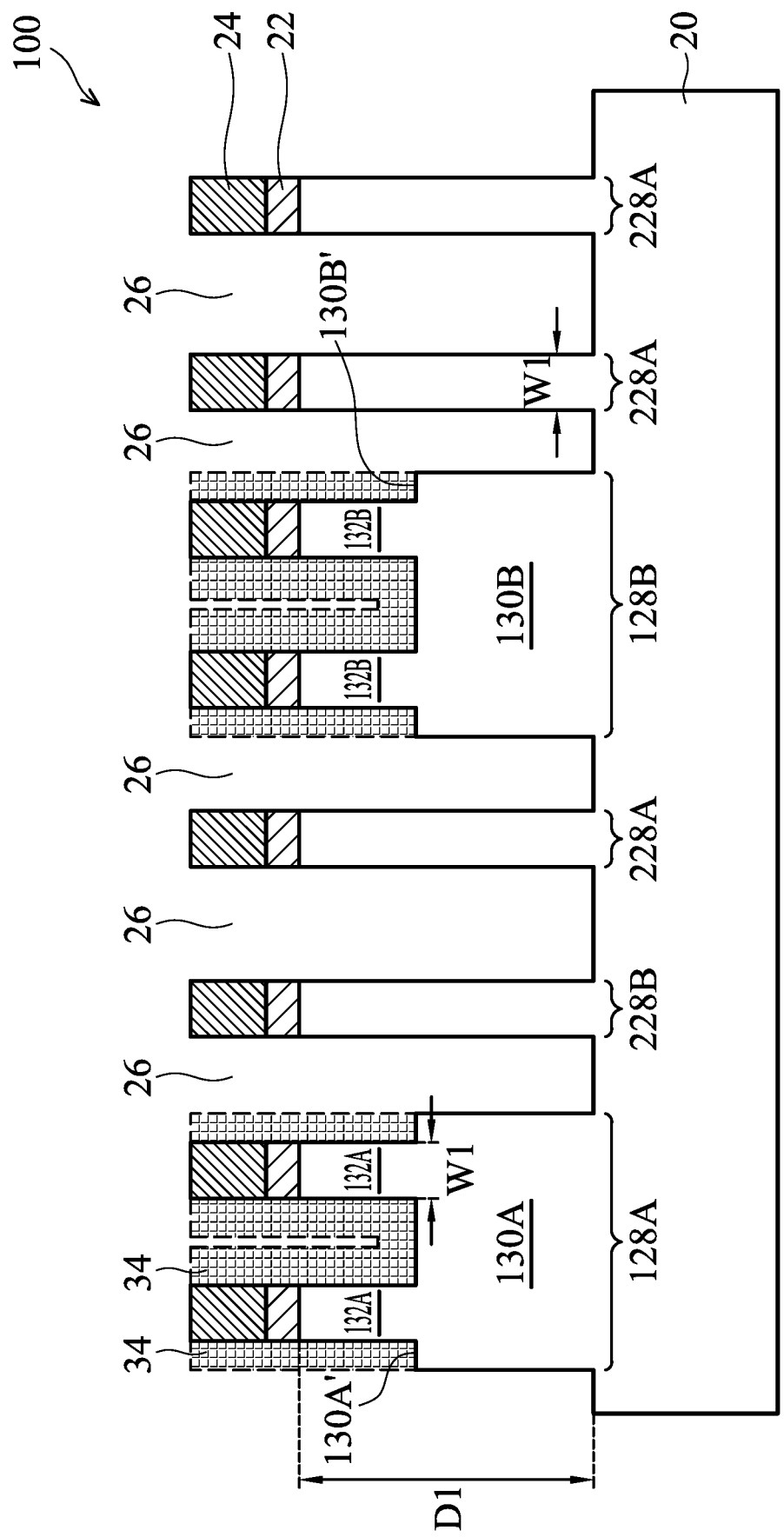

Next, as shown in FIG. 2, hard mask 24, pad oxide 22, and substrate 20 are patterned to form trenches 26. Accordingly, semiconductor strips 128A, 128B, 228A, and 228B are formed. The respective step is illustrated as step 204 in the process flow shown in FIG. 14. Throughout the description, semiconductor strips 128A, 128B, 228A, and 228B are collectively referred to as semiconductor strips 28. Trenches 26 extend into semiconductor substrate 20, and separate semiconductor strips 128A, 128B, 228A, and 228B from each other. In the top view of wafer 100, trenches 26 have elongated portions having lengthwise directions parallel to each other. Furthermore, in the top view of wafer 100, each or some of semiconductor strips 128A, 128B, 228A, and 228B may be encircled by respective trenches 26. In accordance with some embodiments of the present disclosure, depth D1 of trenches 26 is in the range between about 100 nm and about 150 nm. It is appreciated that the values recited throughout the description are examples, and different values may also be adopted without changing the principle of the present disclosure.

In accordance with some embodiments of the present disclosure, semiconductor strips 128A and 128B are referred to as crown-shaped semiconductor strips. Semiconductor strip 128A includes base 130A and semiconductor strips 132A over base 130A. Semiconductor strip 128B includes base 130B and semiconductor strips 132B over base 130B. Although FIG. 2 illustrates that there are two semiconductor strips 132A (or 132B) over base 130A (or 130B), the number of semiconductor strips 132A and 132B on each of the respective bases 130A and 130B may be any integer number such as 1, 2, 3, 4, 5, or more, depending on the designed drive currents of the resulting FinFETs. The top surface 130A' of base 130A and top surface 130B' of base 130B may be substantially planar, or may be slightly curved with dishing.

In accordance with some embodiments of the present disclosure, semiconductor strips 228A and 228B are single-fin strips, wherein the sidewalls of semiconductor strips 228A and 228B are substantially straight, and continuous extend from top to bottom, with no base being formed.

In accordance with some embodiments of the present disclosure, the formation of semiconductor strips 128A, 128B, 228A, and 228B includes etching semiconductor substrate 20 to form strips 132A and 132B, forming sacrificial spacer layers 34 to cover the sidewalls and the bottoms of semiconductor strips 132A and 132B, and using sacrificial spacer layers 34 and hard masks 24 in combination as an etching mask to further etch semiconductor substrate 20. As a result, bases 130A and 130B are formed. Semiconductor strips 228A and 228B have no sacrificial spacer layer 34 to form on their sidewalls, and hence no semiconductor bases are formed underneath. Rather, the top parts of semiconductor strips 228A and 228B may be formed simultaneously with semiconductor strips 132A and 132B, and the bottom parts of semiconductor strips 228A and 228B are formed when semiconductor bases 130A and 130B are formed. The bottoms of semiconductor strips 228A and 228B thus may be substantially coplanar with the bottoms of bases 130A and 130B. The sacrificial spacer layers 34 are then removed.

Semiconductor strips 132A, 132B, 228A, and 228B in combination may be allocated to be a plurality of elongated strips having a uniform pitch, so that the loading effect in the formation of semiconductor strips 28 is reduced. Furthermore, semiconductor strips 132A, 132B, 228A, and 228B may be designed as having a same width W1 in accordance with some embodiments of the present disclosure.

Semiconductors strips 128A and 228A are active regions, on which FinFETs are to be formed. Semiconductors strips 128B and 228B are dummy patterns not to be used for forming FinFETs. Accordingly, in subsequent steps, dummy semiconductors strips 128B and 228B are removed.

It is noted that although semiconductor strips 128A, 128B, 228A, and 228B are shown as closely located to each other, they can be located in different regions of a die in any combination in accordance with some embodiments of the present disclosure. For example, semiconductor regions 128A and 128B may be in a first device region, and semiconductor regions 228A and 228B may be in a second device region separated from the first device region. In accordance with some other embodiments, semiconductor strips 128A, 128B, 228A, and 228B may be arranged as illustrated.

Figure 3:
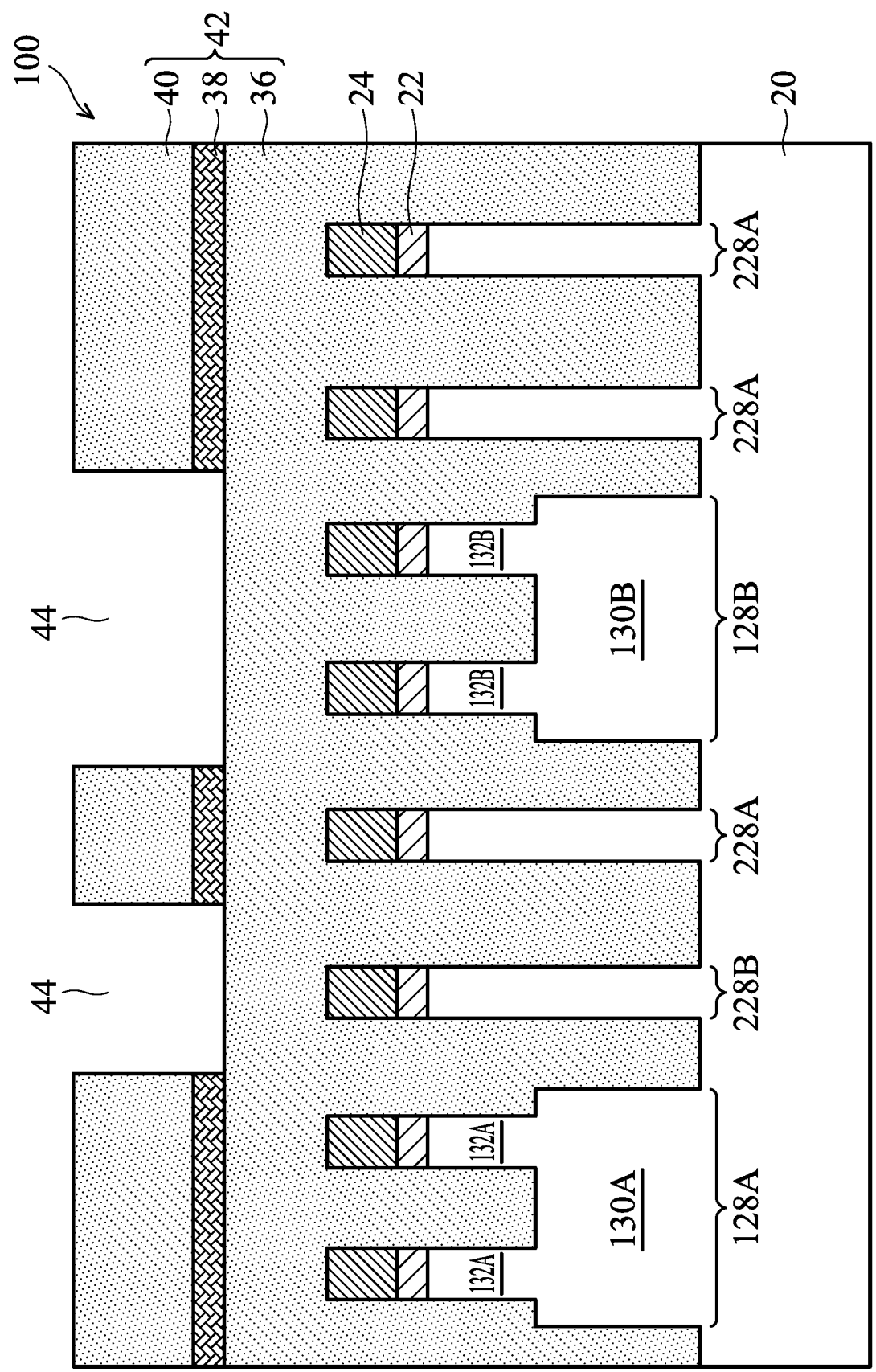

Referring to FIG. 3, a patterned lithography mask is formed. The respective step is illustrated as step 206 in the process flow shown in FIG. 14. In accordance with some embodiments of the present disclosure, the patterned lithography mask includes tri-layer 42, which includes bottom layer (also known as an under layer) 36, middle layer 38 over bottom layer 36, and upper layer 40 over middle layer 38. In accordance with some embodiments of the present disclosure, bottom layer 36 and upper layer 40 are formed of photo resists. Middle layer 38 may be formed of an inorganic material, which may be a carbide (such as silicon oxycarbide), a nitride (such as silicon nitride), an oxynitride (such as silicon oxynitride), an oxide (such as silicon oxide), or the like. Upper layer 40 is patterned to form openings 44, which are vertically aligned to the dummy patterns to be removed.

Next, an anisotropic etching is performed. Middle layer 38 is etched using the patterned upper layer 40 (FIG. 3) as an etching mask, so that the patterns of upper layer 40 are transferred into middle layer 38. During the patterning of middle layer 38, upper layer 40 is at least partially, or entirely, consumed. After middle layer 38 is etched through, bottom layer 36 is patterned anisotropically, wherein middle layer 38 is used as an etching mask. Upper layer 40 will also be fully consumed during the patterning of bottom layer 36 if it has not been fully consumed in the patterning of middle layer 38.

Figure 4:
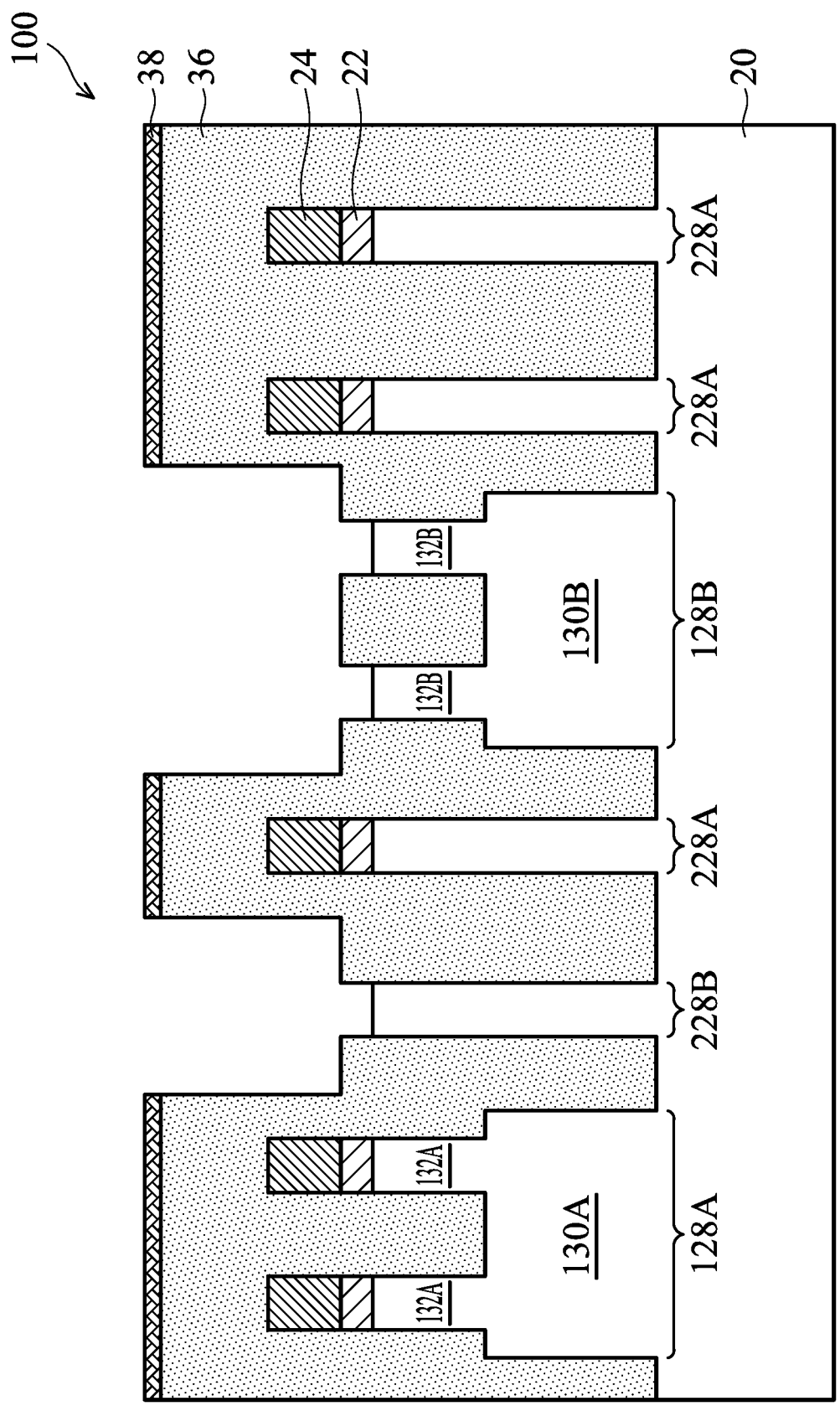

During the etching, hard masks 24 and pad layer 22 are exposed at certain time, and are then etched, exposing underlying dummy semiconductor strips 132B and 228B. The resulting structure is shown in FIG. 4. The exposed dummy semiconductor strips 132B and 228B are then etched. The respective step is illustrated as step 208 in the process flow shown in FIG. 14. Furthermore, with the consumption of under layer 36 and the full removal of semiconductor strips 132B, semiconductor base 130B is also exposed. Semiconductor base 130B and dummy semiconductors strip 128B are then etched in the anisotropic etching process until they are fully removed.

Figure 5:
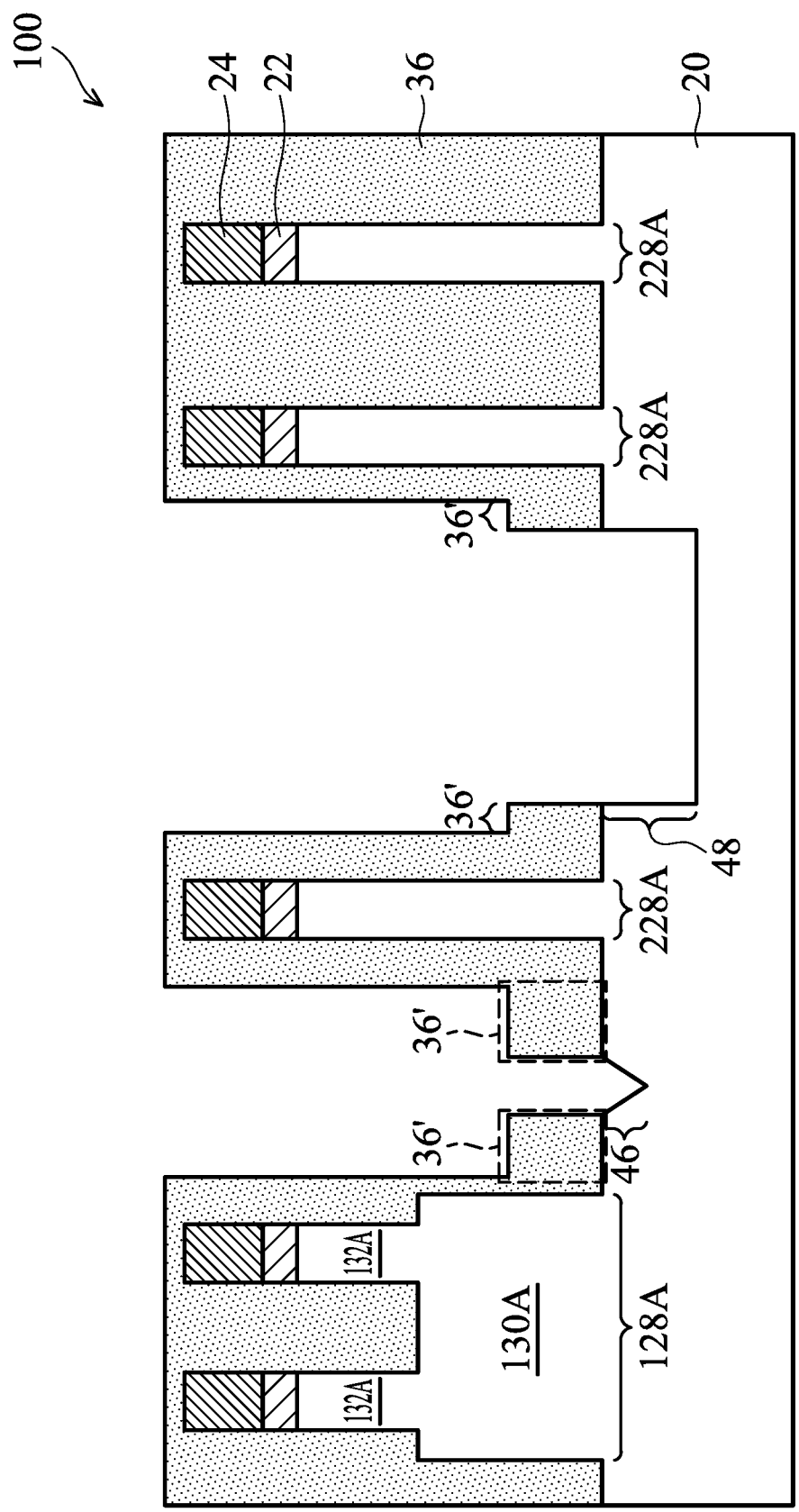

In accordance with some embodiments of the present disclosure, after the full removal of dummy semiconductors strips 128B and 228B, the etching is continued, so that recesses 46 and 48 are formed, as shown in FIG. 5. The respective step is illustrated as step 210 in the process flow shown in FIG. 14. In accordance with some embodiments of the present disclosure, after the formation of recesses 46 and 48, and when the etching is finished, there are still some portions 36' of under layer 36 left not consumed yet. This may be achieved by adjusting the etching recipes. The remaining portions 36' has the function of keeping the widths of recesses 46 and 48 confined to the widths of the respective dummy semiconductors strips 128B and 228B, respectively, and recesses 46 and 48 are not enlarged significantly wider than the respective etched dummy semiconductors strips 128B and 228B. Furthermore, the thicknesses of layers 36, 38, and 40, etc. may also be selected to have appropriate values to ensure the existence of portions 36'.

Figure 6:
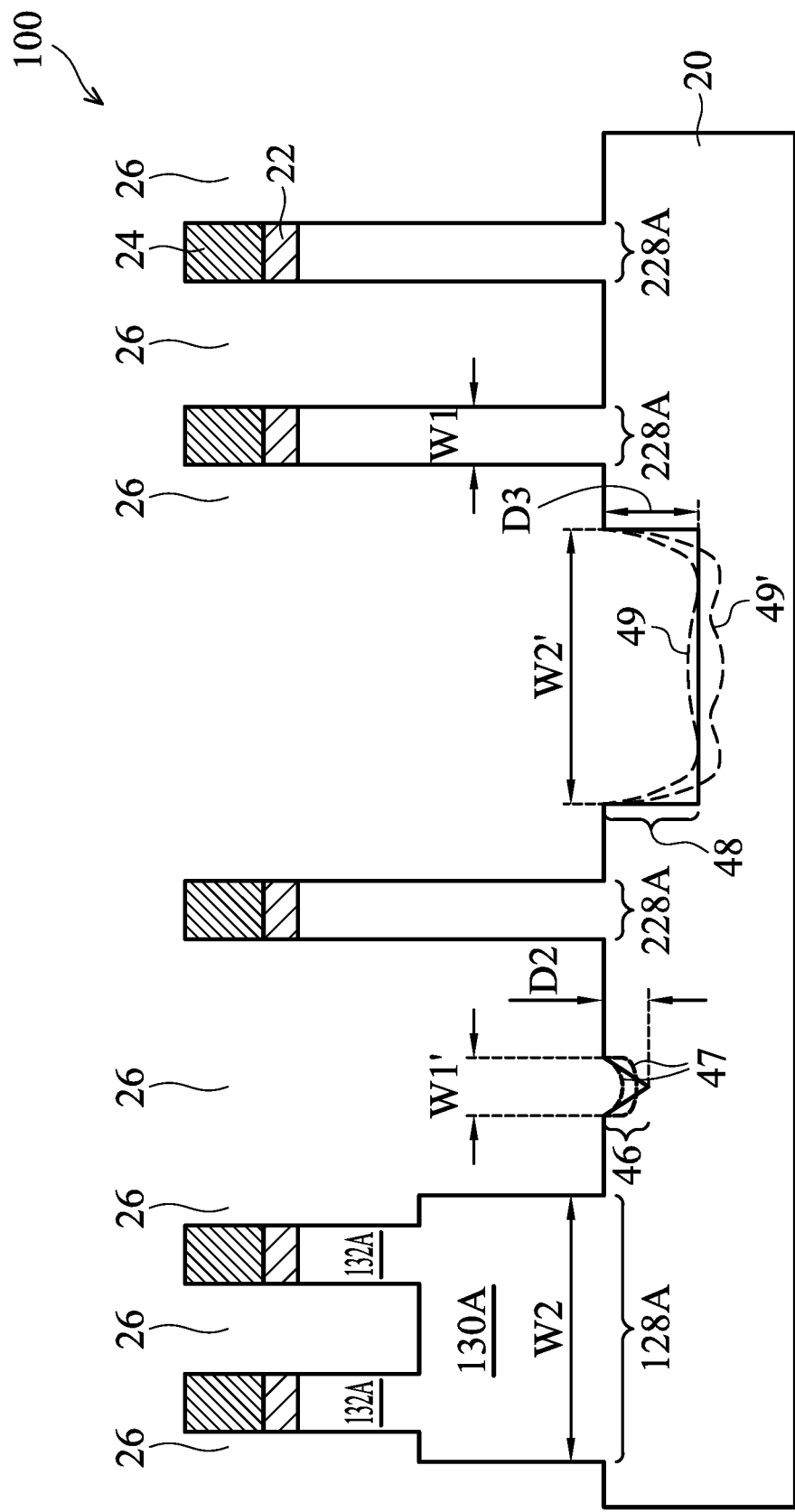

The remaining portions of under layer 36 are then removed, for example, in an ashing process. The resulting structure is shown in FIG. 6. The process is controlled so that after dummy semiconductors strips 128B and 228B are fully removed, a continued etch is performed to further etching the underlying semiconductor substrate 20. In the resulting structure, recesses 46 and 48 extend from the bottom level of semiconductor strips 128A and 228A further down into semiconductor substrate 20. In accordance with some embodiments of the present disclosure, recess 46 is formed as having a V-shape in the cross-sectional view, and recess 48 is formed as having a U-shape in the cross-sectional view. It is appreciated that in actual processes, the V-shape and U-shape may be slightly rounded, and the illustrated straight sidewalls/bottoms may be slightly curved. For example, recess 46 may have a shape as demonstrated by one of dashed lines 47, wherein the edges and the bottoms of recess 46 are slightly curved rather than being fully straight. Furthermore, with the further curving of recess 46, the shape of recess 46 may be close to a shape of a half circle (a bowl-shape). The U-shape of recess 48 may also be similar to the shape as demonstrated by the dashed line 49, wherein there are two, three or more divots at the bottom. The divots are caused by the different etching rates of bottom layer 36 (FIG. 4) and semiconductor strips 132B/130B, and the divots are generated by the faster etching of semiconductor strips 132B/130B than bottom layer 36. Accordingly, the divots are generated directly underlying and aligned to the etched semiconductor strips 132B (FIG. 4). Furthermore, the number of divots is equal to the number of semiconductor strips 132B.

In accordance with some embodiments of the present disclosure, by adjusting etching recipes and adjusting the thicknesses of layers 36, 38, and 40, the divot portions may conversely become protruding portions, as shown by dashed line 49'. Accordingly, the protrusions are generated directly underlying and vertically aligned to the etched semiconductor strips 132B (FIG. 4), with the number of protrusions equal to the number of semiconductor strips 132B. In accordance with other embodiments, by adjusting etching recipes and adjusting the thicknesses of layers 36, 38, and 40, the bottom of recess 48 is substantially coplanar with no divots and protrusions.

In accordance with some embodiments of the present disclosure, width W1 of semiconductor strips 228A is substantially equal to width Wr of recess 46, for example, with a difference smaller than 20 percent or 10 percent of width W1. Similarly, width W2 of semiconductor strips 128A is substantially equal to width W2' of recess 48, for example, with a difference smaller than 20 percent or 10 percent of width W2.

The formation of recesses 46 and 48 advantageously help release stress in wafer 100, and hence the performance of the resulting FinFET is improved due to the formation of recesses 46 and 48. To have a noticeable improvement in the device performance, depth D2 of recess 46 and depth D3 of recess 48 are made to be greater than about 2 nm. For example, depth D2 may be in the range between about 4 nm and about 5 nm, and depth D3 may be in the range between about 8 nm and about 10 nm. Depth D2 of recess 46 may be smaller than depth D3 of recess 48. In accordance with some embodiments of the present disclosure, ratio D3/D2 is in the range between about 1.5 and about 3.

Figure 7:
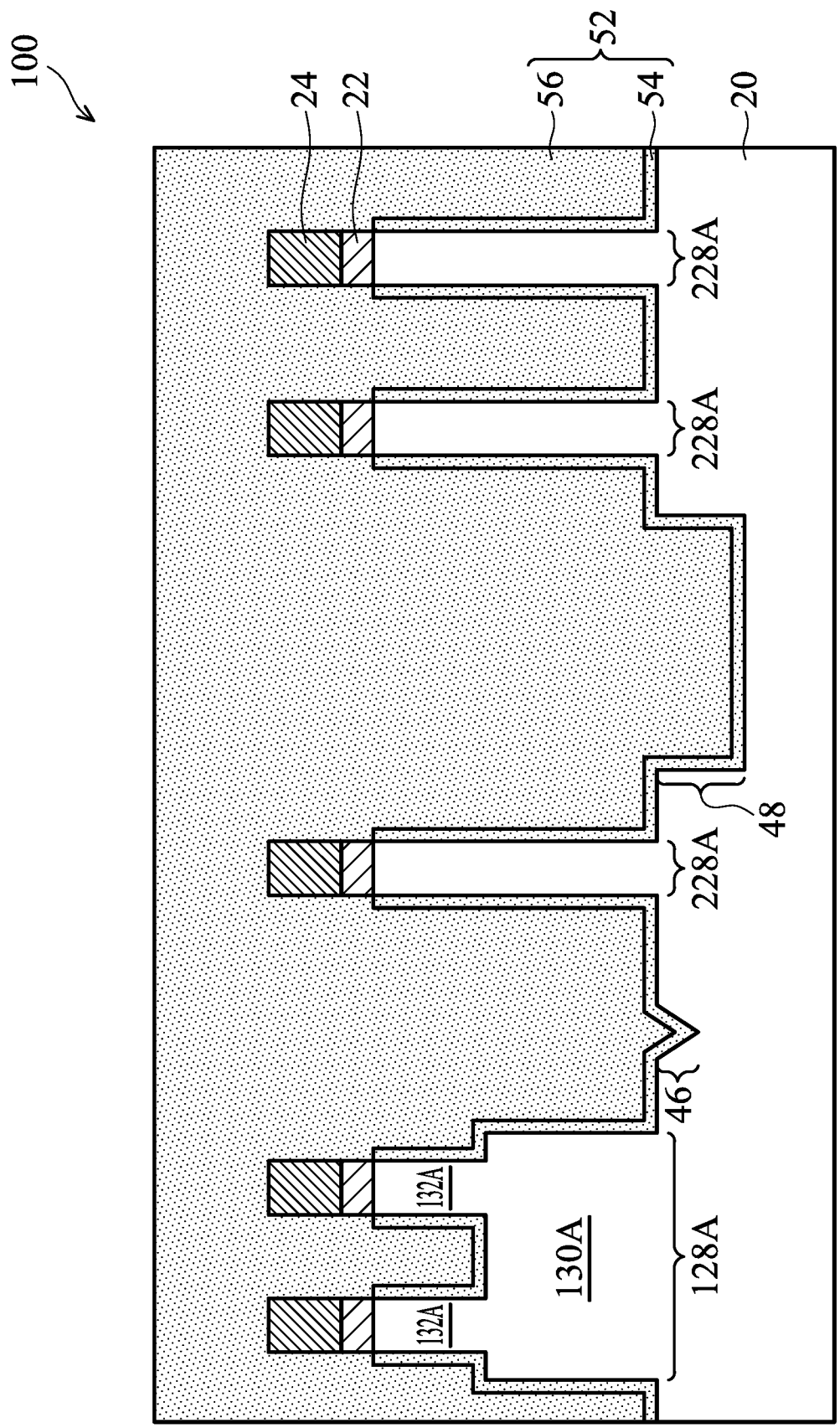

Next, referring to FIG. 7, dielectric region/material 52 is formed to fill trenches 26 and recesses 46 and 48 as shown in FIG. 6. The respective step is illustrated as step 212 in the process flow shown in FIG. 14. In accordance with some embodiments of the present disclosure, dielectric region 52 includes liner oxide 54 and dielectric material 56 over liner oxide 54. Liner oxide 54 may be formed as a conformal layer, whose horizontal portions and vertical portions have thicknesses close to each other. The thickness of liner oxide 54 may be in the range between about 10 Å and about 50 Å. In accordance with some embodiments of the present disclosure, liner oxide 54 is formed by oxidizing wafer 100 in an oxygen-containing environment, for example, through Local Oxidation of Silicon (LOCOS), wherein oxygen ($O_2$) may be included in the respective process gas. In accordance with other embodiments of the present disclosure, liner oxide 54 is formed using In-Situ Steam Generation (ISSG), for example, with water steam or a combined gas of hydrogen ($H_2$) and oxygen ($O_2$) used to oxidize the exposed semiconductor substrate 20 and semiconductor strips 128A and 228A. The ISSG oxidation may be performed at an elevated temperature. In accordance with yet other embodiments, liner oxide 54 is formed using a deposition technique such as Sub Atmospheric Chemical Vapor Deposition (SACVD).

Dielectric material 56 is then formed to fill the remaining portions of trenches 26 and recesses 46 and 48, resulting in the structure shown in FIG. 7. Dielectric material 56 may be formed of silicon oxide, silicon carbide, silicon nitride, or multi-layers thereof. The formation method of dielectric material 56 may be selected from Flowable Chemical Vapor Deposition (FCVD), spin-on coating, Chemical Vapor Deposition (CVD), Atomic Layer Deposition (ALD), High-Density Plasma Chemical Vapor Deposition (HDPCVD), LPCVD, and the like.

In accordance with some embodiments in which FCVD is used, a silicon- and nitrogen-containing precursor (for example, trisilylamine (TSA) or disilylamine (DSA)) is used, and hence the resulting dielectric material 56 is flowable (jelly-like). In accordance with alternative embodiments of the present disclosure, the flowable dielectric material 56 is formed using an alkylamino silane based precursor. During the deposition, plasma is turned on to activate the gaseous precursors for forming the flowable oxide. After dielectric material 56 is formed, an anneal/curing step is performed, which converts flowable dielectric material 56 into a solid dielectric material.

Figure 8:
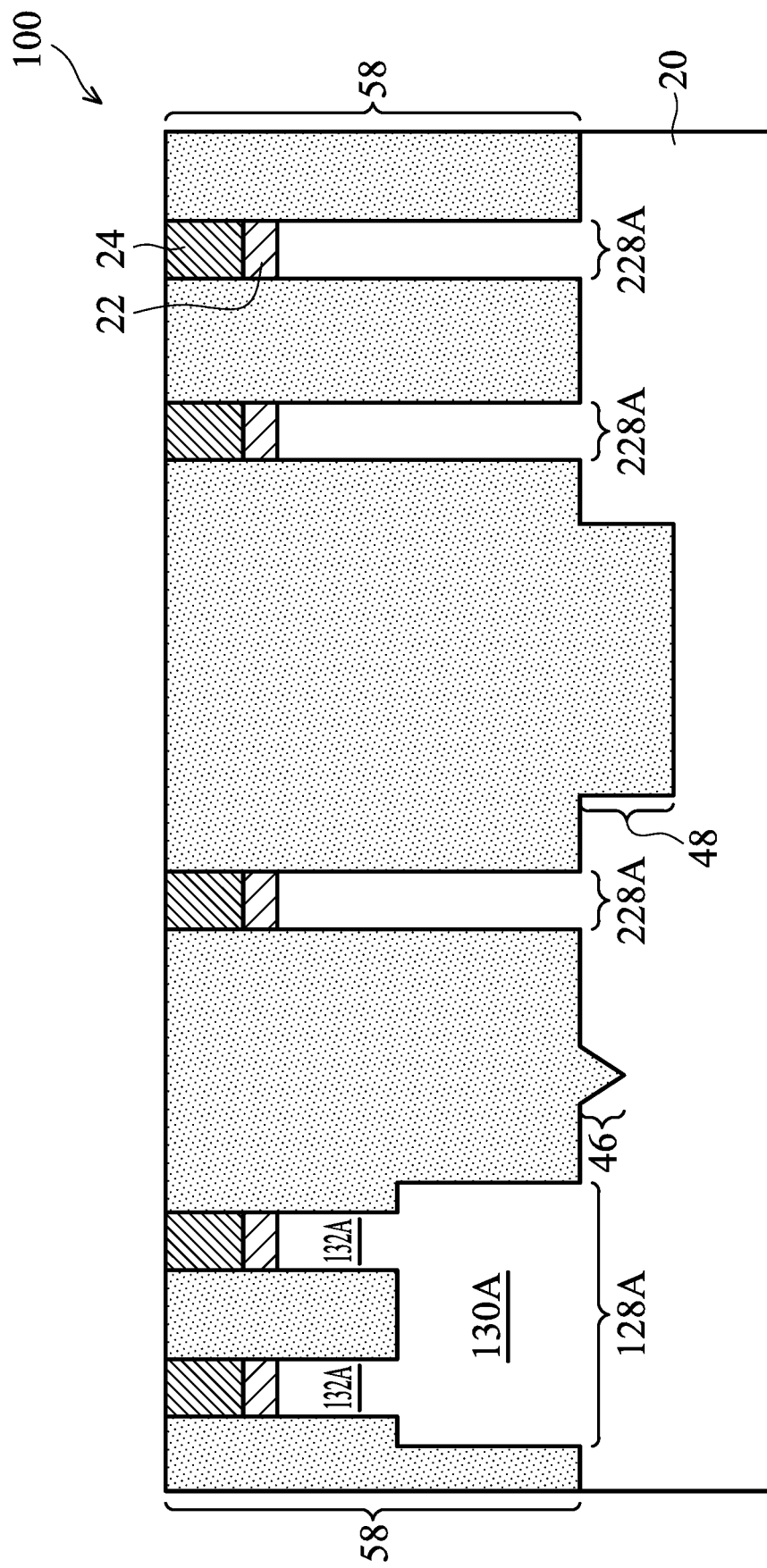

A planarization such as a Chemical Mechanical Polish (CMP) is then performed, as shown in FIG. 8. The respective step is illustrated as step 214 in the process flow shown in FIG. 14. The remaining portions of isolation regions 52 are referred to as Shallow Trench Isolation (STI) regions 58. Mask layer 24 may be used as the CMP stop layer, and hence the top surface of mask layer 24 is substantially coplanar with the top surface of STI regions 58. In FIG. 8 and subsequent figures, liner oxide 54 and dielectric material 56 (refer to FIG. 7) may not be shown separately, although they still exist. The interface between liner oxide 54 and dielectric material 56 may be distinguished due to different material properties such as different types of materials and/or different densities, or may not be distinguishable.

Figure 9:
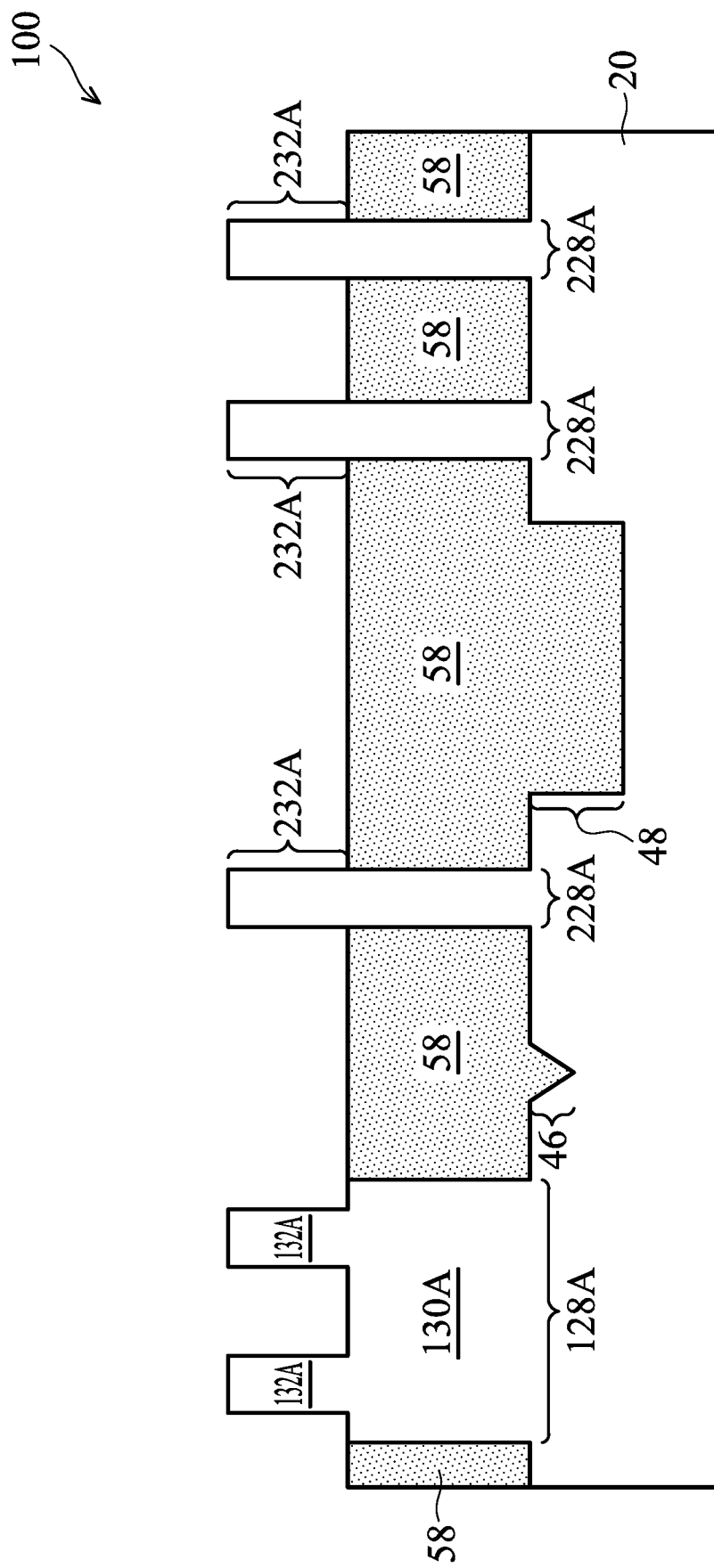

Mask layer 24 is then removed. Mask layer 24, if formed of silicon nitride, may be removed in a wet process using hot $H_3PO_4$ as an etchant. Next, STI regions 58 are recessed, and pad layer 22 may also be removed in the same process. Accordingly, semiconductor fins 132A and 232A are generated. The resulting structure is shown in FIG. 9. The recessing of STI regions 58 is illustrated as step 216 in the process flow shown in FIG. 14. The recessing of STI regions 58 may be performed using an isotropic etching process, which may be a dry etch process or a wet etch process. In accordance with some embodiments of the present disclosure, the recessing of STI regions 58 is performed using a dry etch method, in which the process gases including $NH_3$ and $NF_3$ are used. In accordance with alternative embodiments of the present disclosure, the recessing of STI regions 58 is performed using a wet etch method, in which the etchant solution is a dilution HF solution, which may have an HF concentration lower than about 1 percent.

The recessing of STI regions 58 results in semiconductor fins 132A and 232A to protrude over the top surfaces of STI regions 58. In accordance with some embodiments of the present disclosure, the portions of STI regions 58 directly over base 130A are removed, and the top surfaces of remaining STI regions 58 is substantially coplanar with, or slightly lower than, the top surface of base 130A. In accordance with some embodiments of the present disclosure, the portions of STI regions 58 directly over base 130A have some portions left, and the top surfaces of remaining STI regions 58 is higher than the top surface of base 130A.

Figure 10A:
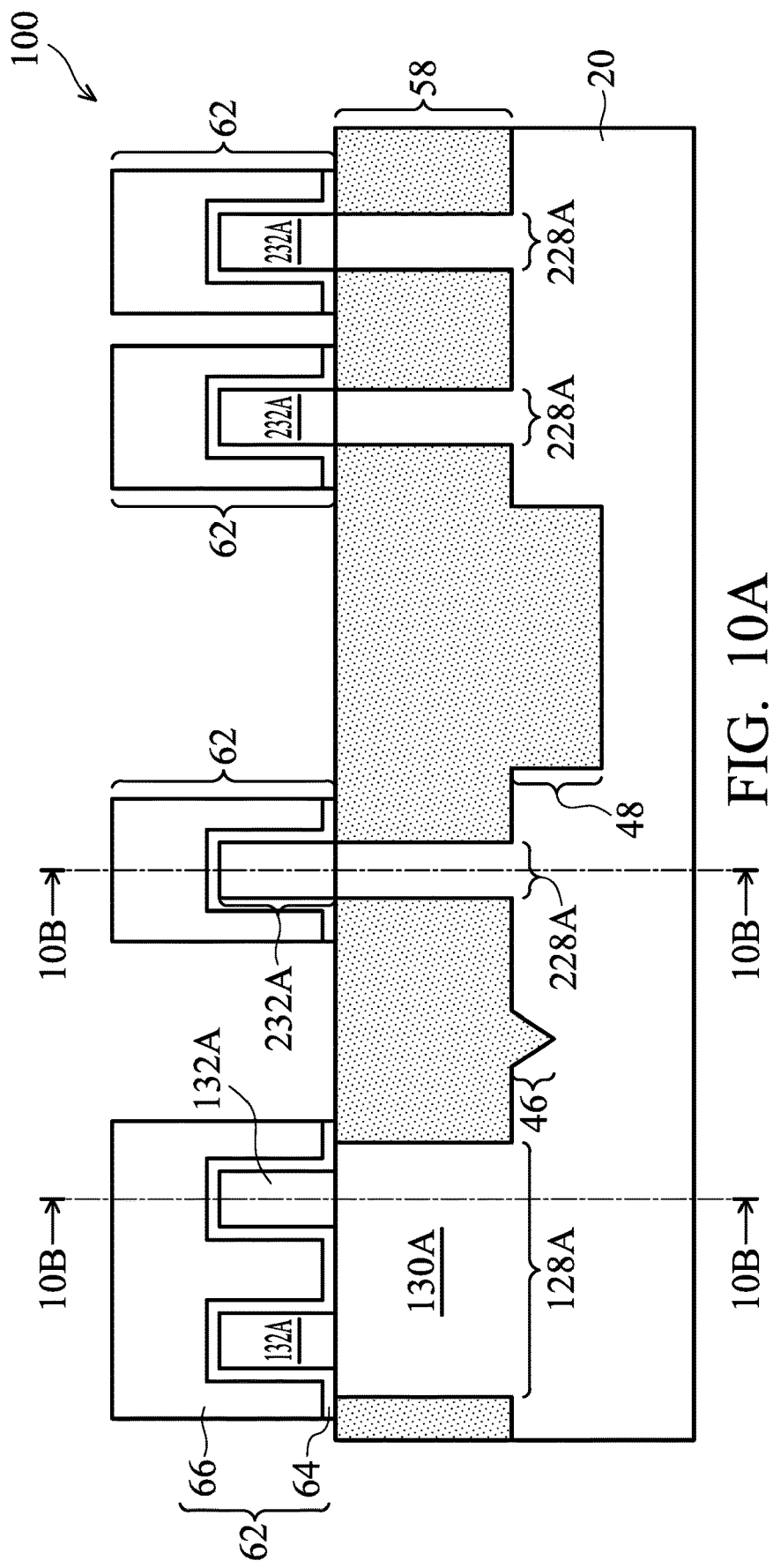
Figure 10B:
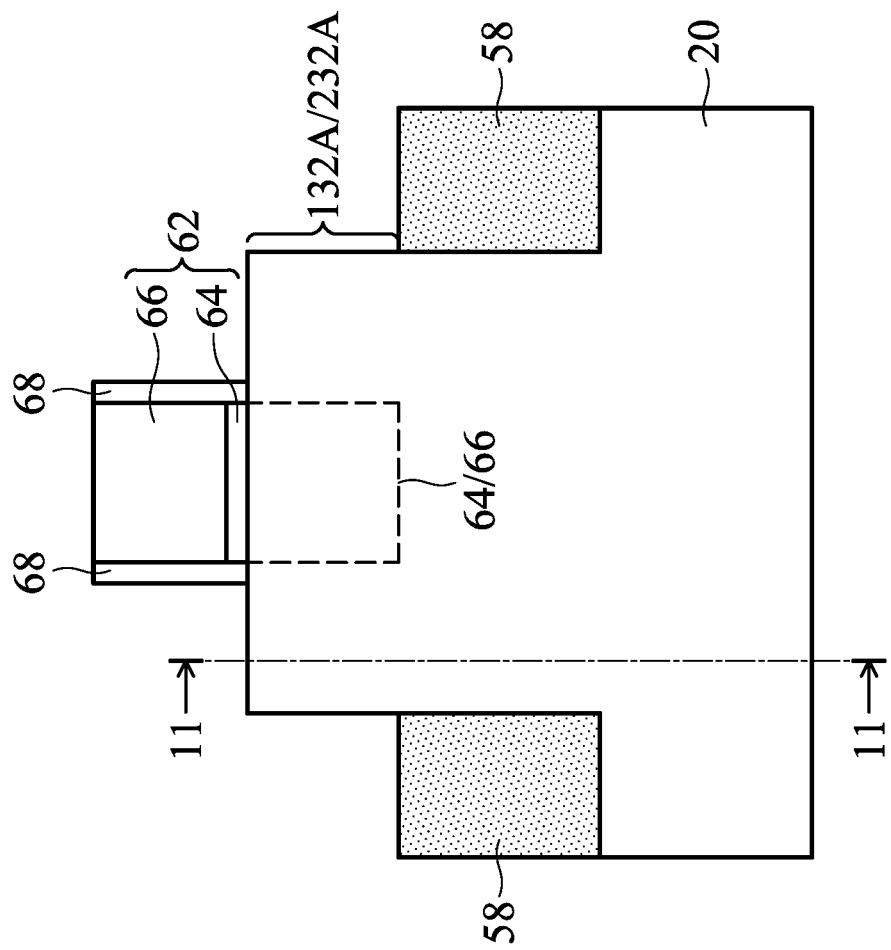

FIG. 10A illustrates the formation of dummy gate stacks 62 in accordance with some embodiments of the present disclosure. The respective step is illustrated as step 218 in the process flow shown in FIG. 14. Dummy gate stacks 62 may include dummy gate dielectric 64 and dummy gate electrode 66 over dummy gate dielectric 64. Dummy gate dielectric 64 may be formed of silicon oxide. Dummy gate electrode 66 may be formed of polysilicon in accordance with some embodiments. FIG. 10B illustrates a cross-sectional view of the structure shown in FIG. 10A, wherein the cross-sectional view may be obtained from the vertical plane containing either one of the lines 10B-10B in FIG. 10A. As shown in FIGS. 10A and 10B, dummy gate stacks 62 are formed on the sidewalls and the top surfaces of the middle portions of the respective semiconductor fins 132A or 232A, with the end portions of semiconductor fins 132A and 232A exposed. Gate spacers 68 are formed on the sidewalls of dummy gate stacks 62.

Figure 11:
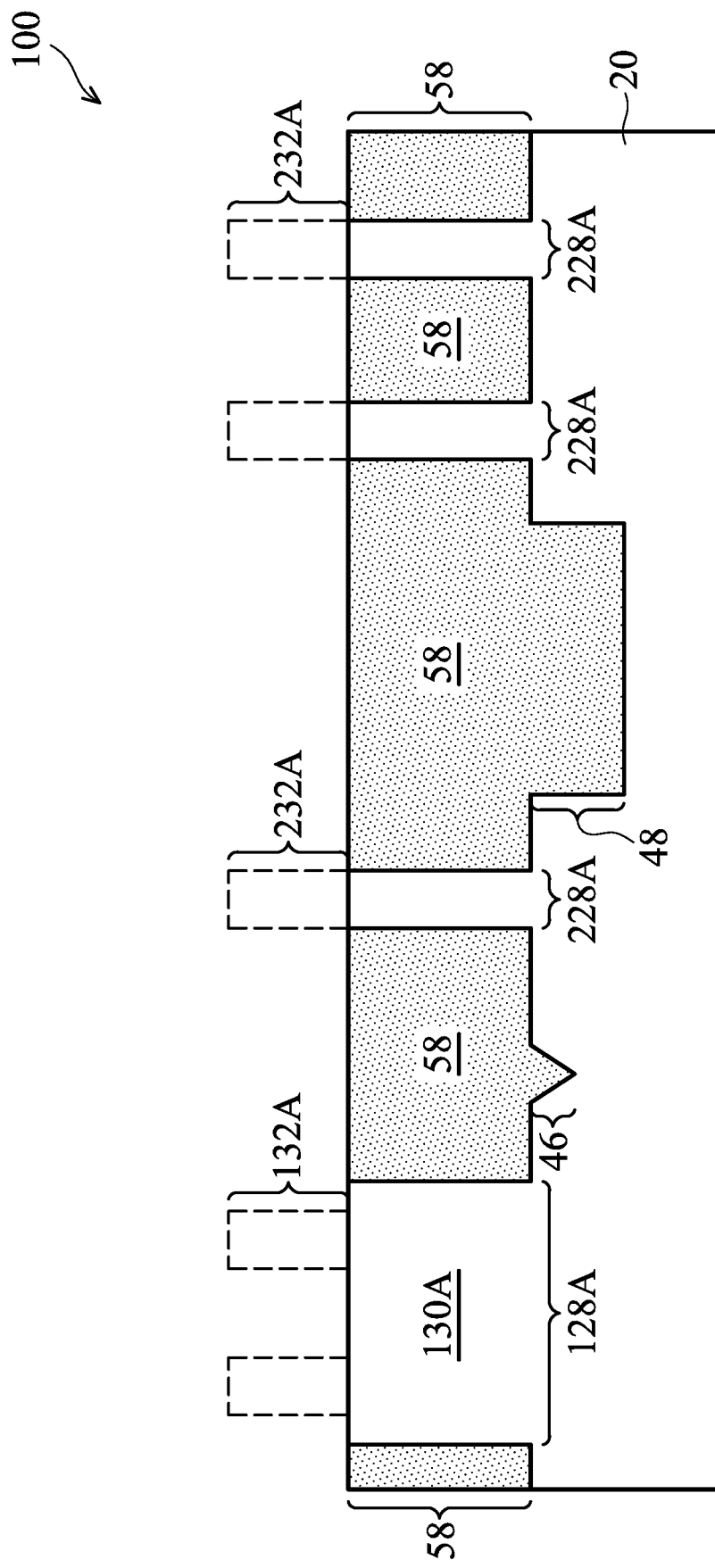

Next, as shown in FIG. 11, the exposed end portions of semiconductor fins 132A and 232A are removed in an etching process, wherein the removed portions of semiconductor fins 132A and 232A are shown as dashed lines. The respective step is illustrated as step 220 in the process flow shown in FIG. 14. The cross-sectional view shown in FIG. 11 is also obtained from the same vertical plan (which passes through an uncovered portion of semiconductor fin(s) 132A/232A) crossing line 11-11 as shown in FIG. 10B. After the etching, the portions of semiconductor fins 132A and 232A directly underling dummy gate stack 62 remain. Since the un-etched portions of semiconductor fins 132A and 232A are not in the illustrated plane, they are shown with dashed lines in FIG. 11.

Figure 12:
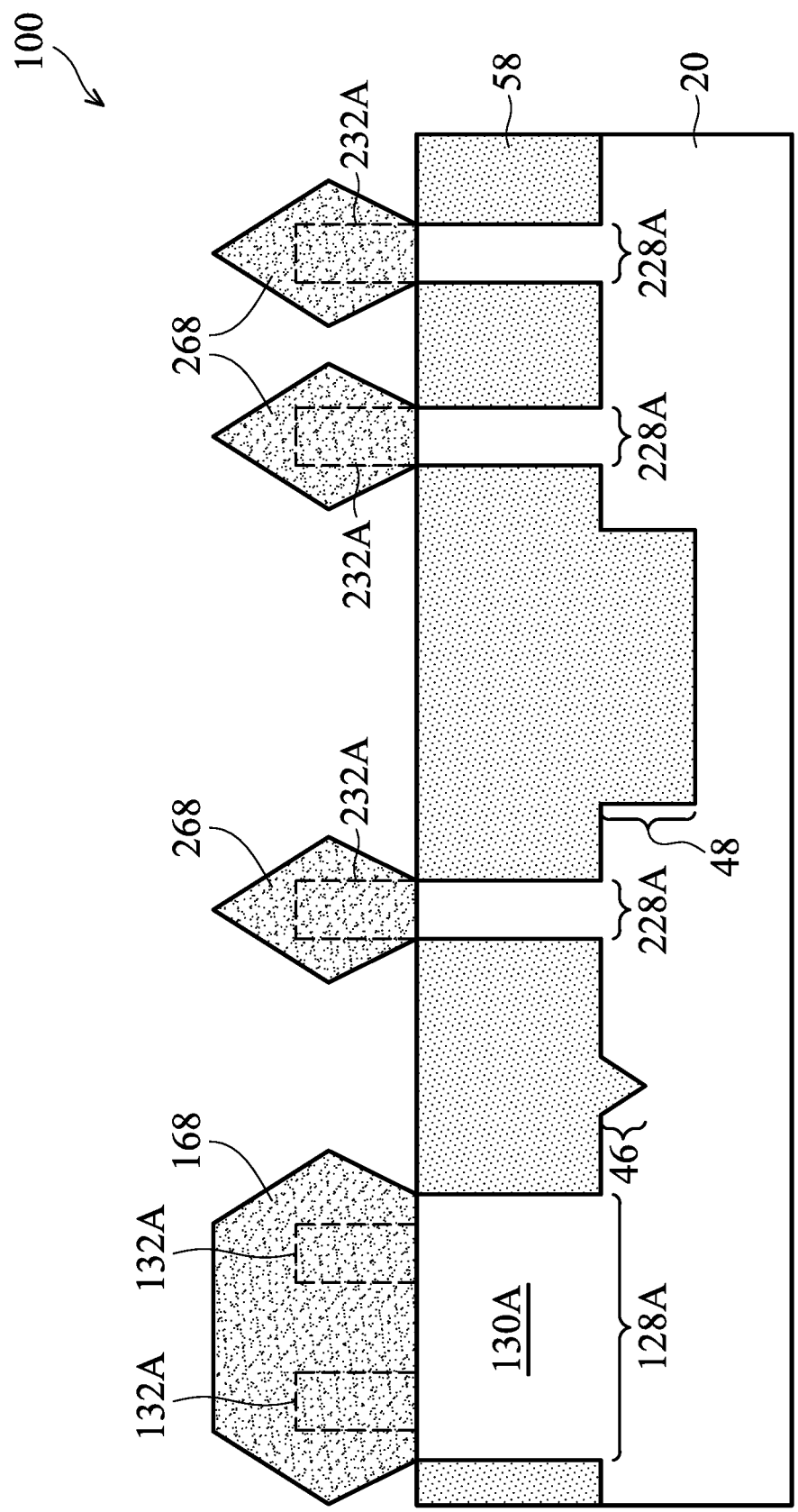

Referring to FIG. 12, an epitaxy is performed to re-grow epitaxy regions 168 and 268. Epitaxy region 168 is grown from the top surface of base 130A. Epitaxy regions 268 are grown from the top surfaces of remaining semiconductor strips 228A. Epitaxy regions 168 and 268 form the source/drain regions of the resulting FinFETs. The epitaxy step is illustrated as step 222 in the process flow shown in FIG. 14. In accordance with some embodiments of the present disclosure, when the desirable conductivity type of the resulting FinFETs are p-type FinFETs, epitaxy regions 168 and 268 may be formed of silicon germanium doped with a p-type impurity such as boron. When the desirable conductivity type of the resulting FinFETs are n-type FinFETs, epitaxy regions 168 and 268 may be formed of silicon phosphorous. Epitaxy regions 168 and 268 may have upward facing facets and downward facing facets in accordance with some embodiments, or may have other shapes.

Figure 13:
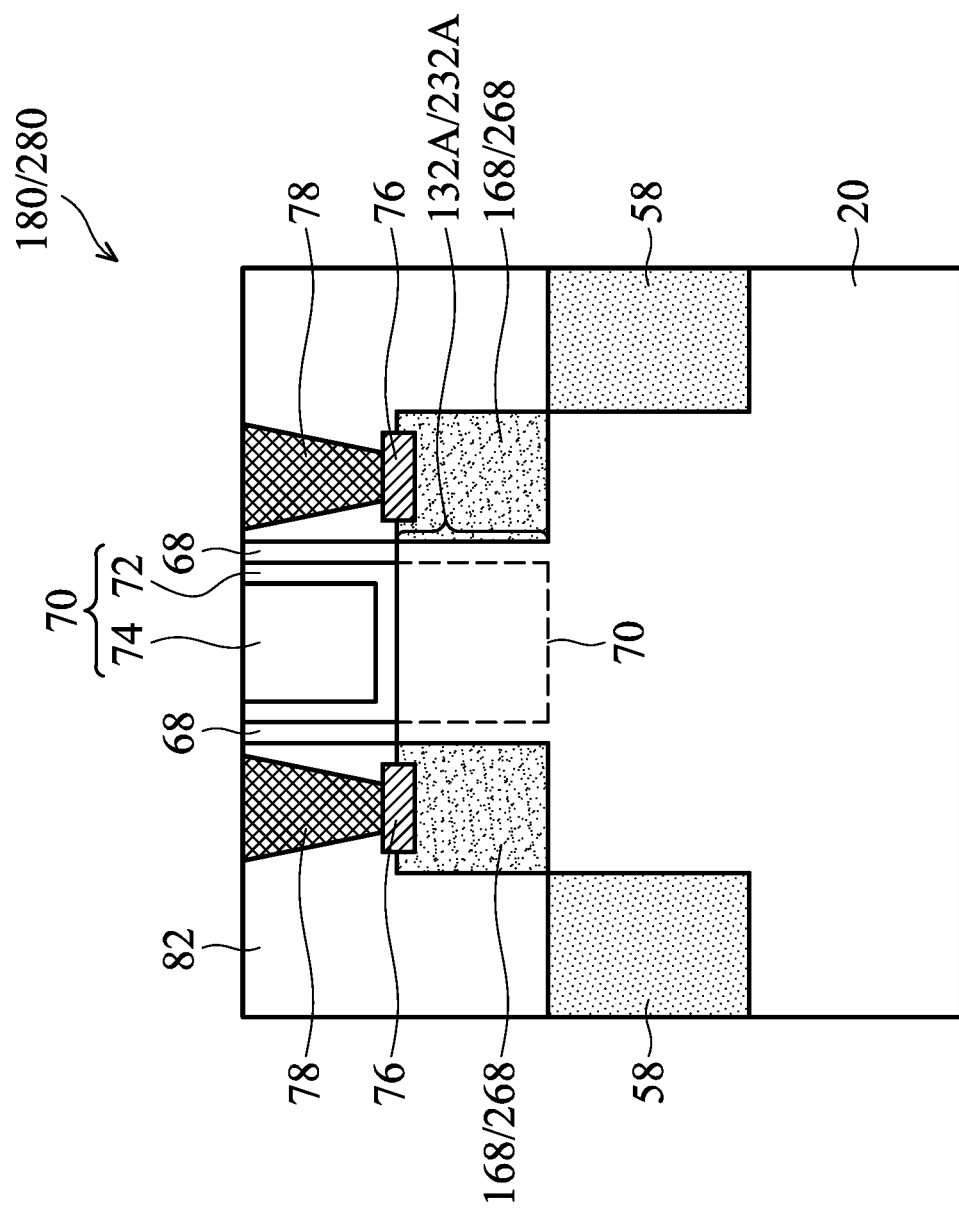
Figure 14:
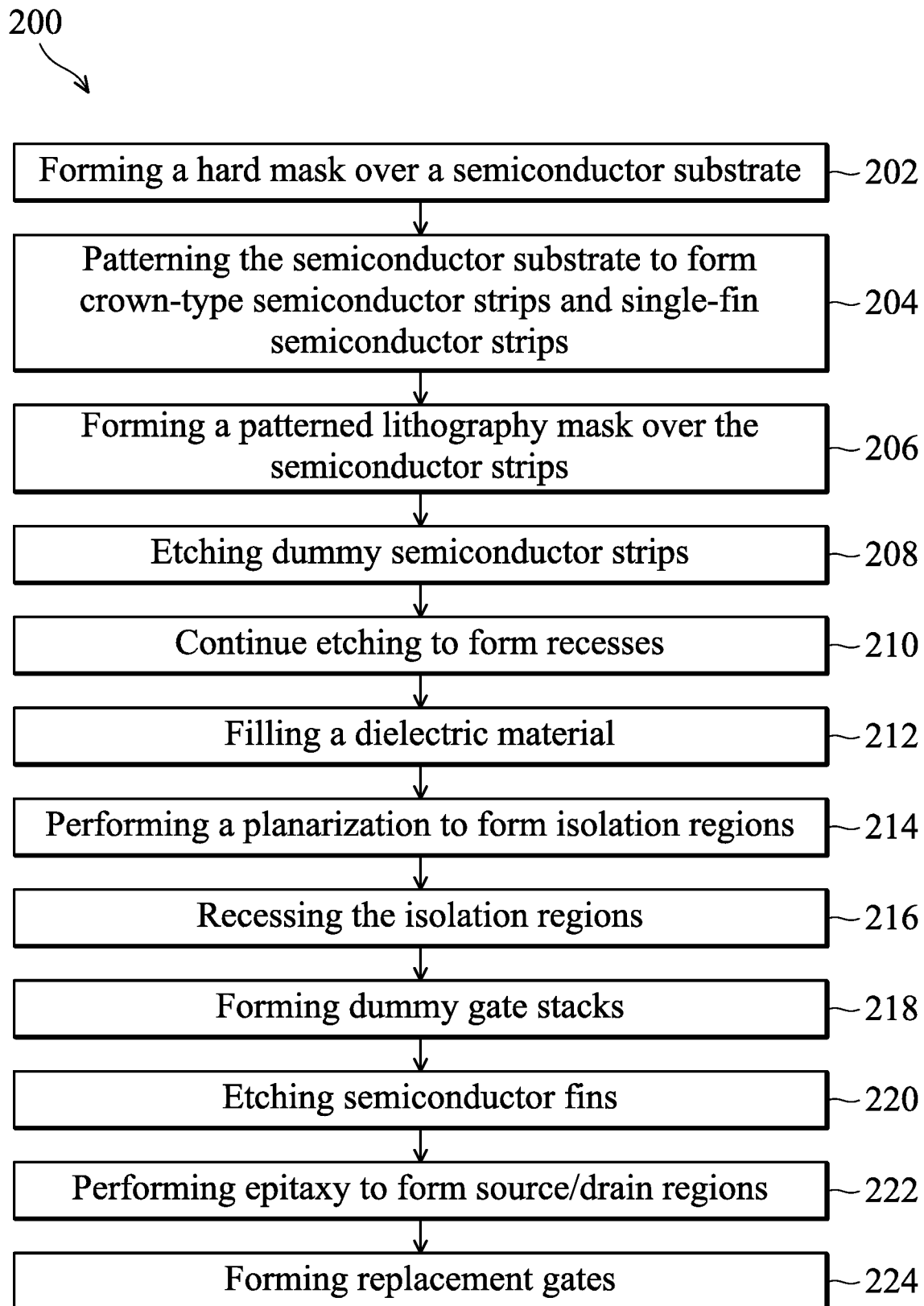
FIG. 14 illustrates a process flow for forming the isolation regions and the FinFETs in accordance with some embodiments.

Subsequently, a plurality of process steps is performed to finish the formation of FinFETs 180 and 280, wherein FinFET 180 represents the FinFET formed from crown-type active region 128A, and FinFET 280 represents the FinFET from the single-fin active regions 228A. An exemplary FinFET is illustrated in FIG. 13, which is marked as 180/280 to indicate that both FinFETs 180 and 280 may have similar cross-sectional views. The dummy gate stacks 60 as shown in FIG. 10A are replaced with replacement gates 70, with one replacement gate 70 shown in FIG. 13. The respective step is illustrated as step 224 in the process flow shown in FIG. 14. Each of replacement gates 70 includes gate dielectric 72 on the top surfaces and sidewalls of the respective fin 132A or 232A, and gate electrode 74 over gate dielectric 72. Gate dielectric 72 may be formed through thermal oxidation, and hence may include thermal silicon oxide. The formation of gate dielectric 72 may also include one or a plurality of deposition steps, and the resulting gate dielectric 72 may include a high-k dielectric material or a non-high-k dielectric material. Gate electrode 74 is then formed on gate dielectric 72, and may be formed of metal stacks. The formation processes of these components are not discussed in detail. Source/drain silicide regions 76 are formed on the surfaces of source/drain regions 168/268. Source/drain contact plugs 78 are formed in Inter-Layer Dielectric (ILD) 82, and are electrically connected to the respective source/drain silicide regions 76.

Referring back to FIG. 12, recesses 46 and 48 are illustrated as formed in the same wafer 100 and the same chip, which is obtained by singulating wafer 100. In accordance with alternative embodiments of the present disclosure, recesses 46 may be formed on a wafer/chip which does not have recesses 48, and recesses 48 may be formed on a wafer/chip which does not have recesses 46. When recesses 46 and 48 are formed on different chips, the depths of recesses 46 and 48 may be adjusted individually to achieve optimized result for reducing stress.

The embodiments of the present disclosure have some advantageous features. By forming recesses in semiconductor wafers and chips, the stress of the wafers and chips are reduced, and the device performance of the FinFETs formed in the wafers and chips is improved. The optimized depths of the recesses and the formation process may be determined by experiments performed on sample wafers, and hence there is no additional manufacturing cost of production wafers when the embodiments of the present disclosure are adopted.

In accordance with some embodiments of the present disclosure, an integrated circuit structure includes a semiconductor substrate having a plurality of semiconductor strips, a first recess formed by two adjacent semiconductor strips among the plurality of semiconductor strips, a second recess formed within the first recess, and an isolation region provided in the first recess and the second recess. The second recess has a lower depth than the first recess.

In accordance with some embodiments of the present disclosure, an integrated circuit structure includes a semiconductor substrate, isolation regions extending into the semiconductor substrate, and a first and a second semiconductor strips in the semiconductor substrate. The first semiconductor strip is a crown-shaped semiconductor strip including a base in the isolation region, and a plurality of semiconductor fins directly over the base. The second semiconductor strip is a single-fin semiconductor strip. A first recess is between first two adjacent semiconductor strips, and a second recess is formed in the first recess. The second recess extends from the bottom levels of the first two adjacent semiconductor strips into a lower portion of the semiconductor substrate. The isolation regions include a first portion extending into the second recess. The second recess and the base of the first semiconductor strip have substantially a same width. A third recess is between second two adjacent semiconductor strips. A fourth recess is formed in the third recess. The fourth recess extends from bottom levels of the second two adjacent semiconductor strips into the lower portion of the semiconductor substrate. The isolation regions include a second portion extending into the fourth recess, and the fourth recess and the second semiconductor strip have substantially a same width.

In accordance with some embodiments of the present disclosure, a method includes forming a first semiconductor strip and a second semiconductor strip from a semiconductor substrate, etching the first semiconductor strip. And etching a portion of the semiconductor substrate directly underlying the etched first semiconductor strip to form a recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a semiconductor substrate comprising a semiconductor strip, wherein the semiconductor strip comprises:
      a base; and
      a plurality of semiconductor fins directly over and connected to the base;
   an isolation region in the semiconductor substrate, the isolation region comprising:
      an upper portion at a same level as the base; and
      a lower portion extending lower than the base, wherein the lower portion is joined to the upper portion, and the lower portion is narrower than the upper portion, and has a same width as the base.

2. The integrated circuit structure of claim 1, wherein the upper portion of the isolation region has a bottom width greater than a top width of the lower portion.

3. The integrated circuit structure of claim 1, wherein a sidewall of the upper portion is connected to a respective sidewall of the lower portion through a top surface of the semiconductor substrate, and the top surface of the semiconductor substrate has a first end joining to the sidewall of the upper portion, and a second end joining the respective sidewall of the lower portion.

4. The integrated circuit structure of claim 1, wherein the lower portion has a U-shaped bottom.

5. The integrated circuit structure of claim 1, wherein a bottom surface of the lower portion comprises:
   a first portion; and
   a plurality of second portions lower than the first portion, wherein two of the plurality of second portions are separated from each other by the first portion.

6. The integrated circuit structure of claim 1, wherein a bottom surface of the lower portion comprises:
   a first portion; and
   a plurality of second portions higher than the first portion, wherein two of the plurality of second portions are separated from each other by the first portion.

7. The integrated circuit structure of claim 1 further comprising:
   a gate stack on top surfaces and sidewalls of the plurality of semiconductor fins.

8. The integrated circuit structure of claim 1, wherein two fins are located directly over and connected to the base.

9. An integrated circuit structure comprising:
   a semiconductor substrate;
   a semiconductor strip comprised in the semiconductor substrate, wherein the semiconductor strip is a crown-shaped semiconductor strip comprising:
      a base; and
      a plurality of semiconductor fins directly over and joined to the base;
   an isolation region extending into the semiconductor substrate, wherein the isolation region comprises a bottom surface, and the bottom surface comprises:
      at least one first portion lower than the base; and
      a plurality of second portions lower than, and joined to, the at least one first portion, wherein the plurality of second portions are separated from each other, and wherein the plurality of second portions and the plurality of semiconductor fins are aligned to positions that have a uniform pitch.

10. The integrated circuit structure of claim 9, wherein the at least one first portion and the plurality of second portions of the bottom surface are connected to have a continuous and wavy shape in a cross-sectional view of the isolation region.

11. The integrated circuit structure of claim 9, wherein the plurality of semiconductor fins and the plurality of second portions of the bottom surface of the isolation region are parallel to each other, and are aligned to parallel straight lines that have a substantially uniform pitch.

12. The integrated circuit structure of claim 9, wherein the bottom surface of the isolation region is lower than a bottom of the base.

13. The integrated circuit structure of claim 9, wherein the at least one first portion comprises a plurality of first portions separated from each other.

14. The integrated circuit structure of claim 9, wherein the plurality of second portions have a pitch equal to a pitch of the plurality of semiconductor fins.

15. The integrated circuit structure of claim 9, wherein the plurality of semiconductor fins comprise portions higher than a top surface of the isolation region.

16. The integrated circuit structure of claim 9 further comprising:
   an epitaxy semiconductor region over the base, wherein the epitaxy semiconductor region is connected to ends of the plurality of semiconductor fins; and
   a gate stack on top surfaces and sidewalls of the plurality of semiconductor fins.

17. The integrated circuit structure of claim 16, wherein the gate stack extends directly over, and contacting a top surface of, the base.

18. An integrated circuit structure comprising:
   a semiconductor substrate comprising a bulk portion;
   a crown-shaped semiconductor strip comprising:
      a base over a top surface of, and joined to, the bulk portion of the semiconductor substrate; and
      a plurality of semiconductor fins overlapping and joined to the base;
   a single-fin semiconductor strip comprising a lower portion level with the base, and an upper portion level with the plurality of semiconductor fins; and
   an isolation region, wherein the isolation region comprises:
      a first portion higher than the top surface of the bulk portion, wherein the first portion comprises a first sidewall contacting a second sidewall of the lower portion of the single-fin semiconductor strip; and
      a second portion lower than the top surface of the bulk portion, wherein the second portion has a same width as the base, and the second portion is directly underlying and joined to the first portion.

19. The integrated circuit structure of claim 18, wherein the second portion of the isolation region further comprises a third sidewall, wherein the first sidewall, the third sidewall, and a portion of the top surface of the bulk portion of the semiconductor substrate form a step.

20. The integrated circuit structure of claim 18, wherein the second portion is narrower than the first portion.

* * * * *

UNITED STATES PATENT AND TRADEMARK OFFICE
CERTIFICATE OF CORRECTION

PATENT NO. : 10,861,800 B2
APPLICATION NO. : 16/426195
DATED : December 8, 2020
INVENTOR(S) : Wan-Chun Kuan et al.

Page 1 of 1

It is certified that error appears in the above-identified patent and that said Letters Patent is hereby corrected as shown below:

On the Title Page

Item (73) Assignee, Line 3, delete "(KR)" and insert --(TW)--.

Signed and Sealed this
Twenty-third Day of March, 2021

Drew Hirshfeld
*Performing the Functions and Duties of the
Under Secretary of Commerce for Intellectual Property and
Director of the United States Patent and Trademark Office*